United States Patent [19]

Sarkozy et al.

[11] Patent Number: 4,484,538

[45] Date of Patent: Nov. 27, 1984

[54] APPARATUS FOR PROVIDING DEPLETION-FREE UNIFORM THICKNESS CVD THIN-FILM ON SEMICONDUCTOR WAFERS

[75] Inventors: Robert F. Sarkozy, Westford; Morris Simson, Framingham, both of Mass.

[73] Assignee: BTU Engineering Corporation, North Billerica, Mass.

[21] Appl. No.: 552,455

[22] Filed: Nov. 16, 1983

[51] Int. Cl.³ .............................................. B05C 13/02
[52] U.S. Cl. ..................................... 118/729; 118/728; 118/500; 206/454; 211/40; 432/253; 432/261
[58] Field of Search ........................ 118/728, 729, 500; 211/40, 41; 269/902; 432/253, 261; 206/564, 587; 427/255, 255.5

[56] References Cited

U.S. PATENT DOCUMENTS 4,069,009 1/1978 Yamawaki et al. ................. 118/500
4,256,229 3/1981 Lee ....................................... 118/728
4,436,509 3/1984 Kocmanek et al. ................. 118/729

OTHER PUBLICATIONS

IBM Technical Disclosure Bulletin vol. 19 No. 10 Mar. 1977 "Wafer Holder".

*Primary Examiner*—Norman Morgenstern
*Assistant Examiner*—Robert J. Steinberger, Jr.

*Attorney, Agent, or Firm*—Weingarten, Schurgin Gagnebin & Hayes

[57] ABSTRACT

A novel apparatus for forming depletion-free uniform thickness CVD thin-film on semiconductor wafers includes a diffusion furnace, a boat loader coupled to the furnace for loading and removing a batch of semiconductor wafers into and out of the furnace, and a semiconductor wafer support boat for removably retaining a plurality of vertically oriented semiconductor wafers on the boat. The boat includes supporting surfaces so arranged that depletion-free uniform thickness thin-film is provided on both sides of each of the vertically oriented wafers. The semiconductor wafer support boat preferably includes two laterally spaced elongated rails each having an undulatory longitudinal section defining plural ridge portions spaced apart by plural valley portions. The ridges on one of the rails are provided with transverse slots that cooperate with confronting transverse slots provided on the confronting ridge portions on the other one of the rails to define a plurality of wafer edge receiving channels. The valley portions of the walls of the rails effectively shift the depletion zone away from each wafer edge receiving channel, thereby providing depletion-free uniform thickness CVD thin-film. The system may advantageously be employed for low temperature photochemical and photosensitized vacuum chemical vapor deposition processes.

12 Claims, 3 Drawing Figures

4,484,538

APPARATUS FOR PROVIDING DEPLETION-FREE UNIFORM THICKNESS CVD THIN-FILM ON SEMICONDUCTOR WAFERS

FIELD OF THE INVENTION

This invention is directed to the field of integrated circuit fabrication, and more particularly, to a novel apparatus for providing depletion-free uniform thickness CVD thin-film on semiconductor wafers.

BACKGROUND OF THE INVENTION

Chemical vapor deposition (CVD) diffusion furnaces are operative to deposit thin-film of selected material on vertically oriented planar semiconductor wafers during the various phases of integrated circuit fabrication. Reactant gas injected into the diffusion furnace pyrolytically reacts and is surface catalyzed to deposit selected thin-film in solid phase on the vertically oriented wafers. In many CVD deposition processes, such as the so-called low pressure photochemical and low pressure photosensitized processes, a phenomenon occurs where the reactant gas is surface catalyzed at the multiple boat-wafer contact points to deposit thin-film in solid phase on the boat to the exclusion of the wafers. The effective zone of depletion extends in many instances over a much greater spatial region than that defined by the actual spatial region physically adjacent the multiple contact points of the individual wafers with the boat, thereby producing wafers having unacceptably non-uniform thin-film deposits. One known technique to eliminate this phenomenon is to array the semiconductor wafers horizontally in a common plane on a support surface. In this manner, reactant gas is surface-catalyzed by an effectively uniform surface so that competition between the support surface and the wafers for the reactant is thereby obviated. However, among other disadvantages, system throughput capability is materially limited, since only a comparatively small number of semiconductor wafers can be horizontally arrayed in a diffusion furnace at one time. A further disadvantage to this approach lies in the fact that particulates generated during the deposition process by necessity fall onto the horizontal wafer surfaces.

SUMMARY OF THE INVENTION

The novel apparatus for providing depletion-free uniform thickness CVD thin-film on semmiconductor wafers of the present invention includes a diffusion furnace having a horizontally extending elongated reaction chamber that is maintained at a preselected temperature and pressure selected for a particular CVD process, and contemplates means for supporting a plurality of semiconductor wafers in spaced-apart relation in the reaction chamber with the plane of each of the wafers parallel to each other and generally coincident with the vertical plane such that depletion-free uniform thickness CVD thin-film is formed on both surfaces of each of the wafers. The diffusion furnace includes a boat loader for inserting and removing the wafers into and out of the reaction chamber. A boat, supported by the boat loader, is provided for removably retaining the wafers at multiple spaced-apart contact points. The walls of the boat connecting successive ones of the multiple contact points slope away therefrom and effectively shift the zone of depletion laterally and downwardly away from corresponding ones of the multiple contact points. In this manner, reactant gas is surface-catalyzed uniformly by the vertically oriented planar surfaces of the wafers, and not by the downwardly sloping walls of the rails of the wafer-support boat, thereby providing depletion-free uniform thickness CVD thin-film on both surfaces of each of the wafers.

Preferably, the boat includes first and second laterally spaced undulatory rails each having a plurality of ridges spaced apart longitudinally by respective intermediate structural portions that define a groove between adjacent ridges. The apex of each ridge on the first and second rails includes a transversely extending wafer receiving slot. Each slot on one of the rails cooperates with a confronting slot on the other one of the rails to define a wafer edge supporting channel. Preferably the rails are fastened in laterally spaced relation by a plurality of transverse rods that each extend between confronting apexes of the grooves of the two rails. The present invention can advantageously be employed in any CVD reaction where depletion is a severe problem. It is particularly applicable to very low temperature photochemical or photosensitized vacuum CVD processes where depletion due to competition between wafer surfaces and support structures for reactant product is extreme.

BRIEF DESCRIPTION OF THE DRAWINGS

These and other features and advantages of the present invention will become apparent as the invention becomes better understood by referring to the following exemplary and non-limiting detailed description of the preferred embodiment, and to the drawings, wherein.

DETAILED DESCRIPTION OF THE PREFERRED EMBODIMENT

Figure 1:
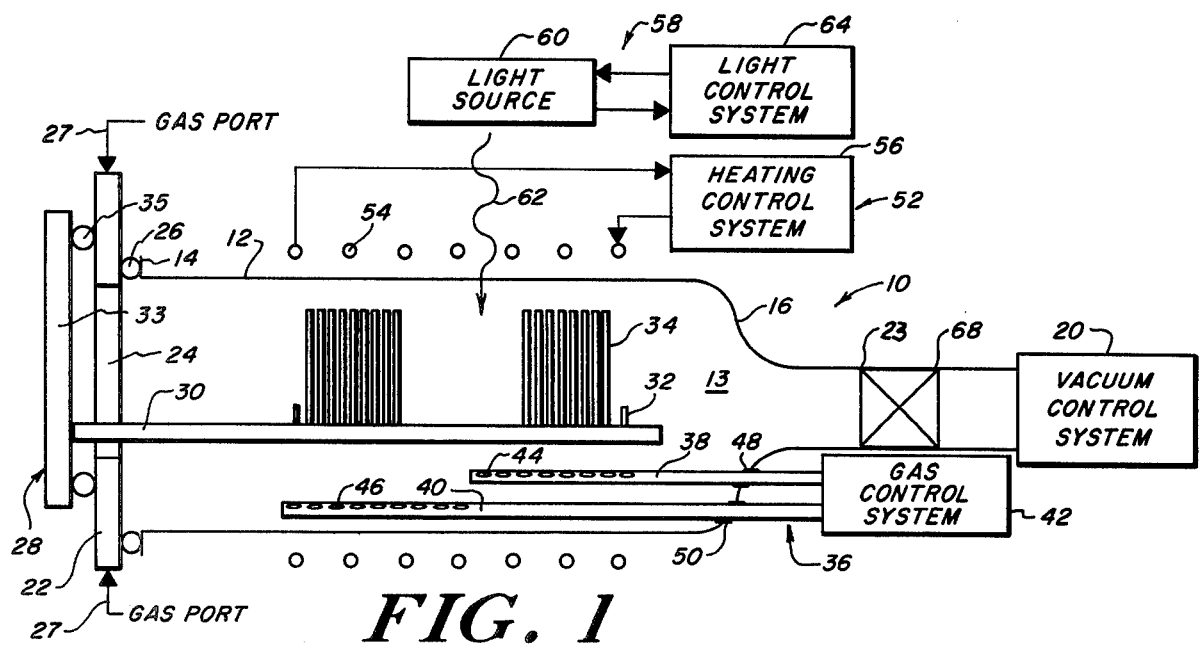
FIG. 1 is a not-to-scale pictorial diagram illustrating the novel apparatus for providing depletion-free uniform thickness CVD thin-film on semiconductor wafers of the present invention.

Referring now to FIG. 1, generally designated at 10 is a novel chemical vapor deposition (CVD) apparatus for providing depletion-free uniform thickness thin-film on semiconductor wafers according to the present invention. The apparatus 10 includes a cylindrical diffusion tube 12, fashioned from any suitable high-temperature resistant material such as quartz, defining a horizontally extending reaction chamber 13. An integral flange 14 is provided on one end of the diffusion tube 12. A neck 16 that tapers to a throat 18 is provided on the other end of the diffusion tube 12. A vacuum control system 20 is connected to the throat 18 via a ball joint valve 23 for controllably evacuating the reaction chamber 13.

A plate 22 having a central bore 24 is removably fastened to the annular flange 14 of the diffusion tube 12 over an O-ring 26 in air-tight sealing engagement therewith. The plate has gas ports 27 in communication with the reaction chamber 13. A boat loading mechanism generally designated 28 having a horizontally extending cantilever arm 30 is provided for inserting a boat 32 to be described having a plurality of semiconductor wafers through the aperture 24 of the plate 22 into the reaction chamber 13 of the diffusion tube 12 for CVD processing, and for removing the wafers therefrom after processing. The boat loader 28 includes a plate 33 connected to a suitable actuator, not shown, for controlling its translation. An O-ring 35 is provided between the plate 33 and the door 22 for providing an air-tight seal therebetween.

A plurality of planar wafers 34 are supported by the boat 32 in spaced relation longitudinally along the length of the diffusion tube 12, with the planar surface of each of the wafers generally coincident with the vertical plane and parallel to each other. As appears below, the boat 32 is operative to provide depletion-free uniform thickness CVD thin-film on both surfaces of each of the wafers 34.

A gas injection system generally designated 36 is provided for controllably injecting one or more reactants in gas phase into the reaction chamber 13. The gas control system 36 preferably includes first and second elongated, cylindrical injection tubes 38, 40 connected on one end to a gas control system 42 and terminating on their other ends in a plurality of gas injection apertures 44, 46. Seals 48, 50 are provided for sealing the tubes 38, 40 in air-tight sealing engagement with the confronting surfaces of the tapering wall of the neck 16 of the tube 12.

A heating system generally designated 52 is provided for controllably establishing the temperature inside the reaction chamber 13. The heating control system in the illustrated embodiment includes heating coils 54 that are wrapped peripherally around the exterior of the diffusion tube 12 and are electrically connected to a heating control system 56. By controlling the current and voltage applied to the coils 54, and by sensing the internal temperature in the reaction chamber, the control system 56 establishes and maintains any desired temperature for a particular CVD process.

A light source generally designated 58 is provided for controllably exciting the reactant gas in the reaction chamber at one or more preselected wavelengths. The source 58 includes a plurality of selected wavelength, high-intensity lamps 60 circumferentially disposed around the diffusion tube, only one of which is illustrated. Photons schematically illustrated at 62 pass through the quartz diffusion tube 12 into the reaction chamber 13 and excite the reactant in gas phase therein. A light source control system 64 is connected to the lamps 60 for monitoring their temperature and for controlling the voltage and current applied thereto for establishing and maintaining only photon excitation of the wavelength selected for the particular CVD process.

By way of example and not by way of limitation, the apparatus 10 can advantageously be employed to batch process semiconductor wafers using the so-called photosensitized (ultraviolet enhanced) vacuum chemical vapor deposition (UV-CVD) process. For this reaction, the vacuum control system is operative to maintain the pressure in the diffusion tube 12 typically at 200 microns, and the gas control system 42 is operative to inject silane ($SiH_4$) through the injection tubes 38, 40 into the reaction chamber 13. Excess oxygen bubbled through a mercury reservoir, not shown, is injected through the gas ports 27 and into the reaction chamber 13. The heating control system 56 is operative to produce a uniform temperature in the reaction chamber of from 75°–300° C., and the high-energy light source 58 is operative to photoexcite the reactant gas at a typical wavelength of 2,537 Å. The apparatus 10 can also advantageously be employed for the so-called direct photochemical vacuum deposition process. For this process as will be appreciated by those skilled in the art, excess oxygen is not bubbled through a mercury reservoir before being injected into the reaction chamber 13 through the ports 27, and the ultraviolet lamps are used to generate radiation at 1849 Å.

Figure 2:
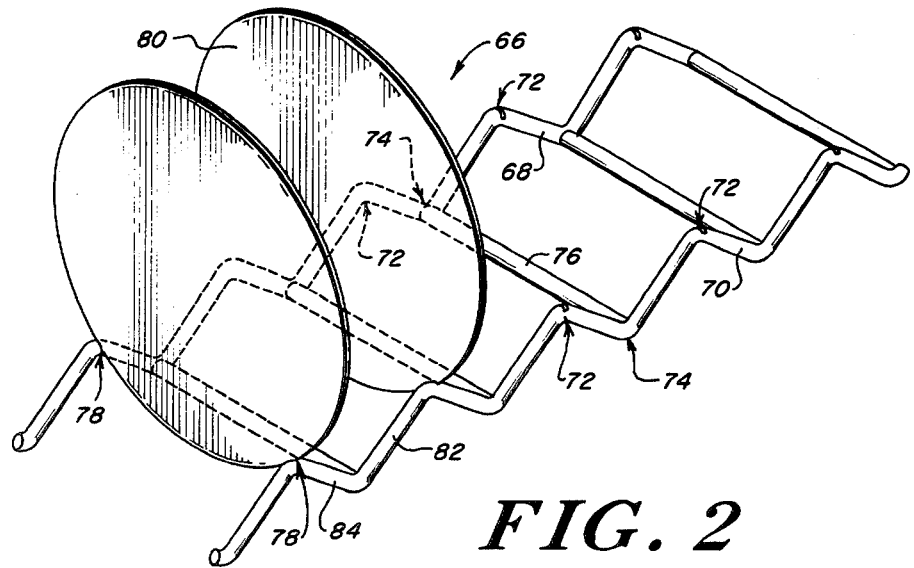
FIG. 2 is a not-to-scale perspective view of a wafer support boat of the apparatus for providing depletion-free uniform thickness CVD thin-film on semiconductor wafers according to the present invention.
Figure 3:
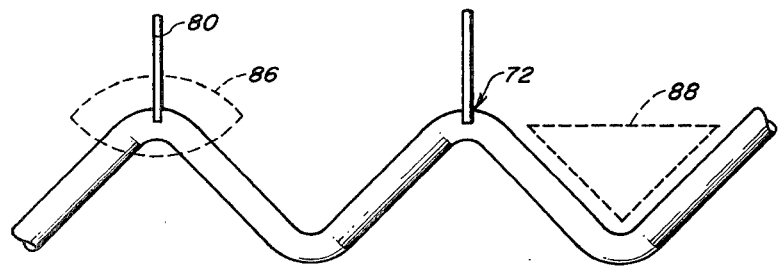
FIG. 3 is a not-to-scale longitudinal sectional view of one of the rails of the wafer support boat of FIG. 2.

Referring now to FIG. 2, generally designated at 66 is a not-to-scale perspective view illustrating a wafer support boat of the apparatus for forming depletion-free uniform thickness CVD thin-film on semiconductor wafers according to the present invention. The boat 66 preferably includes two undulatory side rails 68, 70 laterally spaced in side-by-side relation. Each side rail 68, 70 includes a plurality of spaced ridges generally designated 72, and a plurality of valleys generally designated 74 each intermediate adjacent ones of the ridges 72. A plurality of transversely extending rods 76 are respectively fastened at the apexes of confronting valleys for fastening the side rails 68, 70 together. A plurality of transversely extending slots 78 are provided at the apexes of the ridges 72 on the rails 68, 70 defining between confronting ridges a plurality of channels that are each dimensioned to slidably accept and removably retain an edge of one of a plurality of wafers 80. Each side rail has a positively inclined portion 82 that is adjacent to a negatively inclined portion 84 alternately along the length of each side rail. The portions 82, 84 may be formed from separate segments fastened together defining a sawtooth-shape longitudinal section, or may be formed from a continuous length of rail bent into alternating positively inclined and negatively inclined portions. The valleys 74 may be symmetrically or nonsymmetrically positioned intermediate adjacent ridges 72. As can best be seen in FIG. 3, the only requirement is that the region designated by a dashed circle 86 of each of the rails proximate the points of contact with each of the wafers 80 slope or fall downwardly from each side of the respective planar surfaces of each of the wafers 80. In this manner, a depletion zone schematically illustrated by a dashed triangle 88 is displaced downwardly and to corresponding sides of each of the ridges. Reactant gas thereby is surface-catalyzed by the two planar surfaces of each of the wafers, and not by the walls supporting the wafers, forming depletion-free uniform thickness CVD thin-film thereon.

The rails 68, 70 are preferably fashioned from quartz, and the vertical dimension of each of the slots 78 is preferably one-eighth inch. Each rail preferably has a cross-sectional diameter of about 10 mm, and each transverse rail preferably has the same cross-sectional dimension. The transverse rail 76 may be fastened to the confronting apexes of the valley portions by any suitable means, such as tack welds.

It will be appreciated that many modifications of the presently disclosed invention will become apparent to those skilled in the art without departing from the scope of the appended claims.

What is claimed is:

1. A chemical vapor deposition apparatus for providing depletion-free uniform thickness thin-film on semiconductor wafers, comprising:
   a cylindrical diffusion tube defining a reaction chamber;

means coupled to said diffusion tube for controllably providing a selected temperature in said reaction chamber;

means coupled to said tube for providing an intended pressure in said reaction chamber;

means coupled to said tube for uniformly injecting reactant in gas phase into said reaction chamber;

means including a longitudinally extending arm for loading said substrates into said reaction chamber and for removing the wafers from said chambers; and a boat supported on said arm for removably retaining said plurality of wafers in said reaction chamber with the plane of each of said wafers generally coincident with the vertical plane and spaced apart longitudinally in parallel relation along said reaction chamber, said boat including means defining a plurality of ridges that are selectively spaced apart longitudinally by respective intermediate structural portions, each of the intermediate structural portions sloping laterally and downwardly away from a corresponding one of adjacent ridges defining a valley between adjacent ridges; each of said ridges having a transversely extending wafer edge receiving slot.

2. The apparatus of claim 1, wherein said means includes first and second rails in laterally spaced relation, where each rail has a plurality of spaced ridges, adjacent ones of which are separated by a valley, and means for fastening said rails together.

3. The apparatus of claim 2, wherein said fastening means includes a plurality of transversely extending rods fastened between confronting apexes of said valleys.

4. The apparatus of claim 3, wherein said transversely extending rods are tack-welded at their ends to respective ones of said confronting apexes.

5. The apparatus of claim 2, further including means connected to said diffusion tube for energizing said reactant in gas phase in said reaction chamber with light at a selected wavelength.

6. The apparatus of claim 2, wherein said rails have a longitudinal section defining an undulatory shape.

7. The apparatus of claim 6, wherein said rails define a longitudinal section having a sawtooth shape.

8. Apparatus for use with a CVD diffusion furnace for providing depletion-free uniform thickness thin-film on semiconductor wafers, comprising:

a boat for removably retaining a plurality of semiconductor wafers, with the plane of each of the wafers coincident with the vertical plane and longitudinally spaced apart in parallel orientation, said boat including an elongated structural member having a plurality of ridge portions selectively spaced apart longitudinally by respective intermediate portions defining a valley between adjacent ridge portions, each of said ridge portions having a transversely extending wafer edge receiving slot.

9. The apparatus of claim 8, wherein said elongated structural member includes a first side rail, and further including a second elongated side rail in laterally spaced relation with said first side rail.

10. The apparatus of claim 9, further including means for fastening said first and second side rails together with confronting slots colinearly aligned defining a wafer edge receiving channel.

11. The apparatus of claim 10, wherein each of said side rails defines a longitudinal section having an undulatory shape.

12. The apparatus of claim 11, wherein each of said side rails defines a longitudinal section having a sawtooth shape.

* * * * *